US008995686B2

(12) United States Patent
Naito

(10) Patent No.: US 8,995,686 B2
(45) Date of Patent: Mar. 31, 2015

(54) SOUND VOLUME CONTROL DEVICE, SOUND VOLUME CONTROL METHOD, AND SOUND VOLUME CONTROL PROGRAM

(75) Inventor: Joji Naito, Zushi (JP)

(73) Assignee: JVC Kenwood Corporation, Yokohama-shi, Kanagawa (JP)

( * ) Notice: Subject to any disclaimer, the term of this patent is extended or adjusted under 35 U.S.C. 154(b) by 391 days.

(21) Appl. No.: 13/410,954

(22) Filed: Mar. 2, 2012

(65) Prior Publication Data

US 2012/0224720 A1 Sep. 6, 2012

(30) Foreign Application Priority Data

Mar. 3, 2011 (JP) ................................ P2011-046120

(51) Int. Cl.
*H03G 3/00* (2006.01)
*H04R 25/00* (2006.01)

(52) U.S. Cl.
CPC .............. *H04R 25/70* (2013.01); *H04R 25/356* (2013.01); *H04R 25/505* (2013.01); *H04R 2225/39* (2013.01); *H04R 2430/01* (2013.01)
USPC ............................ 381/107; 381/104; 381/109

(58) Field of Classification Search
CPC ........... H04R 2225/00; H04R 2225/39; H04R 2225/43; H04R 2225/61; H04R 25/00; H04R 25/356; H04R 25/505; H04R 25/70; H04R 25/30
USPC .............. 381/104–109, 112, 60, 23.1, 80, 81, 381/94.2, 94.3, 98
See application file for complete search history.

(56) References Cited

U.S. PATENT DOCUMENTS 5,838,801 A * 11/1998 Ishige et al. .................. 381/321
6,628,795 B1 * 9/2003 Ludvigsen .................... 381/321

(Continued)

FOREIGN PATENT DOCUMENTS

JP 61228712 10/1986
JP 62-125800 A 6/1987

(Continued)

OTHER PUBLICATIONS

European Search Report issued on Jun. 27, 2012, in counterpart European Patent Application 12001393.3.

(Continued)

*Primary Examiner* — Xu Mei
(74) *Attorney, Agent, or Firm* — Nath, Goldberg & Meyer; Jerald L. Meyer; Stanley N. Protigal

(57) ABSTRACT

A sound volume control device includes a sound input section, a band dividing section, an excessive output notification section, a correction band decision section and a sound output control section. The sound input section converts input sound into a sound signal. The band dividing section carries out band-division with respect to the sound signal. The excessive output notification section outputs excessive output notification information when output sound from the present device is excessive. The correction band decision section calculates audible signal distribution information when the excessive output notification information is not output and excessive signal distribution information when the excessive output notification information is output, for each band in the sound signal, and decides a correction band according to the audible signal distribution information and excessive signal distribution information. The sound output control section controls sound volume of sound signal for the correction band to provide output sound.

8 Claims, 4 Drawing Sheets

(56) References Cited

U.S. PATENT DOCUMENTS

| | | | | |
|---|---|---|---|---|
| 6,651,040 | B1 * | 11/2003 | Bakis et al. | 704/225 |
| 2002/0090096 | A1 * | 7/2002 | Blind et al. | 381/104 |
| 2009/0196436 | A1 * | 8/2009 | Westenbroek | 381/104 |
| 2011/0255712 | A1 * | 10/2011 | Urata | 381/107 |

FOREIGN PATENT DOCUMENTS

| | | | |
|---|---|---|---|
| JP | 2001-204098 | A | 7/2001 |
| JP | 2006303825 | | 11/2006 |
| JP | 2009147701 | | 7/2009 |
| JP | 2010109624 | | 5/2010 |
| KR | 100974153 | B1 | 8/2010 |
| WO | 2009/068028 | A1 | 6/2009 |
| WO | WO 2010044439 | A1 * | 4/2010 |

OTHER PUBLICATIONS

Official Action issued in Japanese Patent Application No. 2011-046120 dated Feb. 4, 2014.

* cited by examiner

SOUND VOLUME CONTROL DEVICE, SOUND VOLUME CONTROL METHOD, AND SOUND VOLUME CONTROL PROGRAM

CROSS REFERENCE TO RELATED APPLICATION

This application claims benefit of priority under 35 U.S.C. §119 to Japanese Patent Applications No. 2011-046120 filed on Mar. 3, 2011, the entire contents of which are incorporated by reference herein.

BACKGROUND OF THE INVENTION

1. Field of the Invention

The present invention relates to a sound volume control device and a sound volume control method for collecting and amplifying an acoustic signal such as a hearing aid and a sound collector.

2. Description of the Related Art

For a hearing-impaired person, not only it is difficult to hear small sound but also a comfortably-acceptable sound level is limited. Moreover, there is a case in which, after the sound has reached an audible level, the sound is felt to be annoying comparatively soon as the sound volume is further increased. It has been known that hearing impairment showing such a recruitment phenomenon exists. Accordingly, in an device which inputs sound simply collected by a microphone into an amplifier and increases sound volume to an audible level by increasing volume of the amplifier to provide the amplified sound for hearing using an earphone, there arises a problem depending on the kind of hearing impairment that the sound volume becomes excessive when the sound volume has changed in a sound source.

Therefore, an auditory supplement device for a hearing-impaired person such as a hearing aid needs to have amplification characteristics set to fit an individual's auditory property, and this is one of reasons why adjustment is difficult and requires fitting by a specialist or the like.

Accordingly, there have been proposed conventionally an acoustic characteristic checking device (refer to Patent document 1 "Japanese Patent Application Laid-Open Publication No. S62-125800", for example) such as an order-made type hearing aid in which the acoustic characteristics of the order-made type hearing aid are fitted with the auditory property of a hearing-impaired person when the hearing-impaired person purchases the order-made type hearing aid, and a hearing aid adjustment device or a hearing aid (refer to Patent document 2 "Japanese Patent Application Laid-Open Publication No. 2001-204098, for example) which is configured to provide a sound quality suitable for an individual user thereof by asking the subject to hear audibility data in a range from a minimum audible value to an uncomfortable threshold value.

However, since each of the sound volume control devices of Patent documents 1 and 2 is configured to ask the user to actually hear test audibility data, there is a problem that burden on a user of the subject is heavy.

Further, the subject feels difference between component ratios of frequency components included in the audibility data used for the measurement and those included in sound felt to be annoying in actual life. Accordingly, there is also a problem that, only by the measurement using test equipment which provides limited test sound, it is difficult to specify acceptable maximum sound volume for each frequency band and it cannot be expected to obtain a good result.

Further, when the excessive sound volume is avoided by means of compressing a dynamic range across the whole frequency band, sometimes target sound is buried in noise and the sound becomes difficult to hear and poor in expression.

SUMMARY OF THE INVENTION

The present invention, for solving the above problem, aims at providing a sound volume control device and a sound volume control method which can adjust a maximum output sound level in a band in which a user feels in actual life that sound is excessive, without asking the user to hear test audibility data.

In order to resolve the above problem, a sound volume control device of the present invention comprises: a sound input section that converts input sound into a sound signal; a band dividing section that carries out band-division with respect to the sound signal; an excessive output notification section that outputs excessive output notification information according to user' s operation; a correction band decision section that calculates audible signal distribution information of the user when the excessive output notification information is not output and excessive signal distribution information of the user when the excessive output notification information is output, for each band in the sound signal subject to the band-division in the band dividing section, and decides a correction band according to the calculated audible signal distribution information and excessive signal distribution information, and a sound output control section that controls sound volume of sound signal for the correction band decided by the correction band decision section to provide output sound, among bands in the sound signal subject to the band-division in the band dividing section.

The correction band decision section may include: an audible signal distribution information calculating section that calculates a signal level value for a frame when the excessive output notification information is not output and calculates the audible signal distribution information showing occurrence frequency distribution of frames having the same signal level value within a predetermined measurement time, for each band in the sound signal subject to the band-division in the band dividing section; an audible signal distribution information storing section that stores the audible signal distribution information calculated by the audible signal distribution information calculating section; an excessive signal distribution information calculating section that calculates a signal level value for a frame when the excessive output notification information is output and calculates the excessive signal distribution information showing occurrence frequency distribution of frames having the same signal level value within a predetermined measurement time, for each band in the sound signal subject to the band-division in the band dividing section; an excessive signal distribution information storing section that stores the excessive signal distribution information calculated by the excessive signal distribution information calculating section, and a frequency comparison correction band decision section that compares the occurrence frequency in the audible signal distribution information stored in the audible signal distribution information storing section and the occurrence frequency in the excessive signal distribution information stored in the excessive signal distribution information storing section, for each band in the sound signal subject to the band-division in the band dividing section, and decides, as a correction band, a band in which the occurrence frequency in the excessive signal distribution information is larger than the occurrence frequency in the audible signal distribution information.

The audible signal distribution information storing section and the excessive signal distribution information storing section may delete the stored audible signal distribution information and the stored excessive signal distribution information sequentially from older information, respectively.

The frequency comparison correction band decision section may compare the occurrence frequency in the audible signal distribution information and the occurrence frequency in the excessive signal distribution information in the vicinity of a predetermined maximum audible sound volume level for each band in the sound signal subject to the band-division in the band dividing section, and decide, as the correction band, the band in which the occurrence frequency in the excessive signal distribution information is larger than the occurrence frequency in the audible signal distribution information.

The sound output control section may control sound volume by reducing apart exceeding the predetermined maximum audible sound volume level in the correction band decided by the correction band decision section down to an audible sound volume level according to a predetermined limiter curve and outputs the sound volume, and set the predetermined maximum audible sound volume level to be lower every time receiving the excessive output notification from the excessive output notification section.

The sound output control section may control sound volume by multiplying by a predetermined compression rate a part exceeding the predetermined maximum audible sound volume level in the correction band decided by the correction band decision section to compress a dynamic range and outputs the sound volume, and set a compression rate of the dynamic range to be larger every time receiving the excessive output notification from the excessive output notification section.

In order to resolve the above problem, a sound volume control device of the present invention comprises: a sound input section that converts input sound into a sound signal; a fast Fourier transform section that carries out fast-Fourier transform with respect to the sound signal and outputs Fourier coefficients; an excessive output notification section that outputs excessive output notification information according to user's operation; a correction band decision section that calculates audible signal distribution information of the user when the excessive output notification information is not output and excessive signal distribution information of the user when the excessive output notification information is output, using the Fourier coefficients from the fast Fourier transform section, and decides a correction band according to the calculated audible signal distribution information and excessive signal distribution information; and a sound output control section that controls sound volume of sound signal for a Fourier coefficient corresponding to the correction band decided by the correction band decision section to provide output sound, among the Fourier coefficients in the sound signal from the fast Fourier transform section.

In order to resolve the above problem, a sound volume control method of the present invention comprises the steps of: converting input sound into a sound signal; carrying out band-division with respect to the sound signal; determining whether or not excessive output notification information is output by user's operation; calculating a signal level value for a frame when the excessive output notification information is not output and calculating audible signal distribution information showing occurrence frequency distribution of frames having the same signal level value within a predetermined measurement time, for each band in the sound signal; calculating a signal level value for a frame when the excessive output notification information is output and calculating excessive signal distribution information showing occurrence frequency distribution of frames having the same signal level value within a predetermined measurement time, for each band in the sound signal; comparing the audible signal distribution information and the excessive signal distribution information for each band in the sound signal and deciding a correction band according to the comparison result; and controlling sound volume of sound signal for the correction band to provide output sound.

In order to resolve the above problem, a sound volume control program of the present invention causing a computer to execute the steps of: converting input sound into a sound signal; carrying out band-division with respect to the sound signal; determining whether or not excessive output notification information is output by user's operation; calculating a signal level value for a frame when the excessive output notification information is not output and calculating audible signal distribution information showing occurrence frequency distribution of frames having the same signal level value within a predetermined measurement time, for each band in the sound signal; calculating a signal level value for a frame when the excessive output notification information is output and calculating excessive signal distribution information showing occurrence frequency distribution of the frames having the same signal level value within a predetermined measurement time, for each band in the sound signal; comparing the audible signal distribution information and the excessive signal distribution information for each band in the sound signal and deciding a correction band according to the comparison result; and controlling sound volume of sound signal for the correction band to provide output sound.

According to the sound volume control device and the sound volume control method of the present invention, it is possible to adjust a maximum output level of sound in a band in which a user feels in actual life that sound is excessive, without asking the user to hear test audibility data.

DESCRIPTION OF THE EMBODIMENTS

Sound volume control devices according to first and second embodiments of the present invention will be described below. Note that a hearing aid, a sound collector or the like to be used by a hearing-impaired person will be described as an example of the sound volume control devices according to the first and second embodiments of the present invention.

(First Embodiment)

First, a sound volume control device according to the first embodiment of the present invention will be described.

Figure 1:
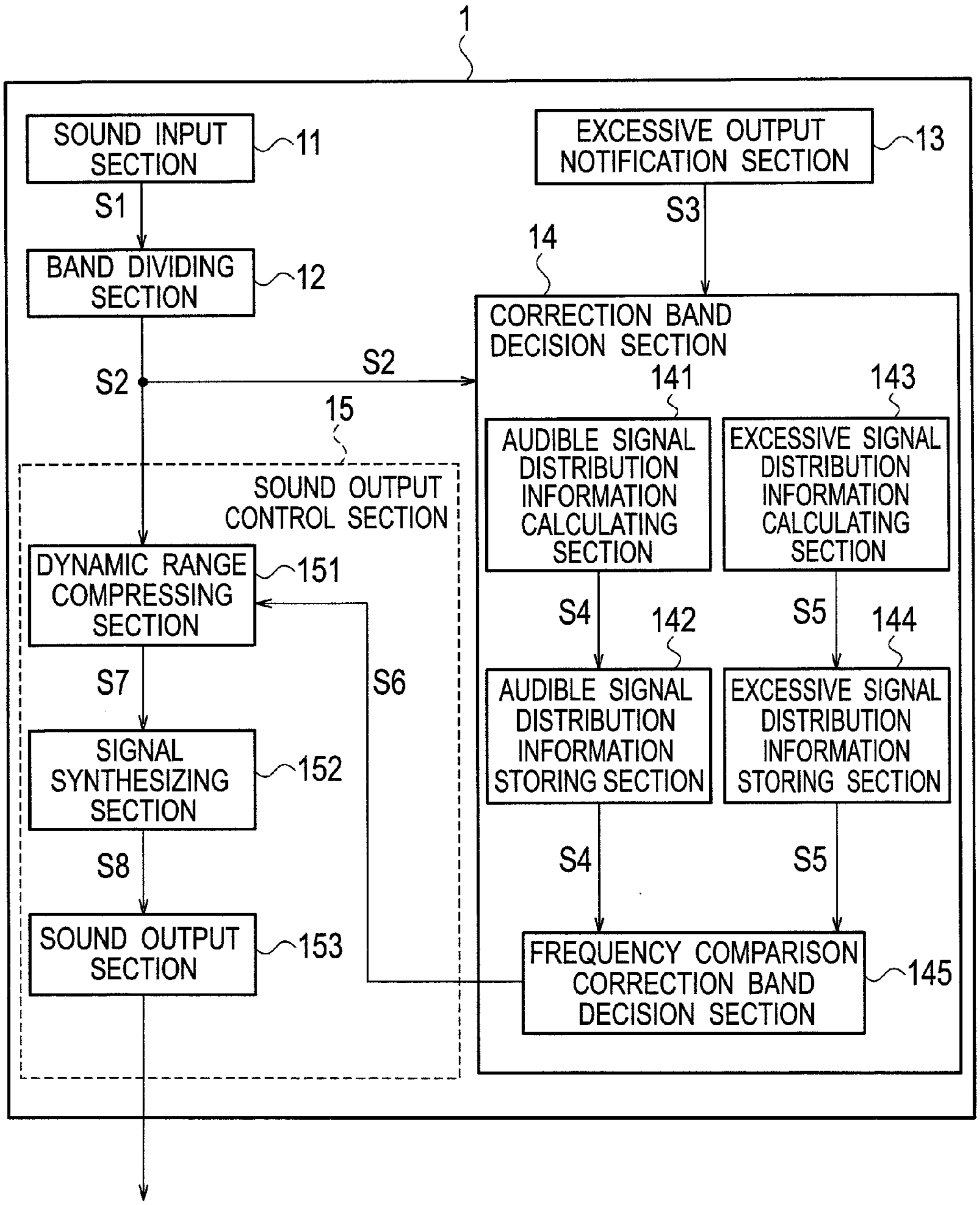
FIG. 1 is a block diagram showing a configuration example of a sound volume control device according to a first embodiment of the present invention.

In FIG. 1, the sound volume control device 1 includes a sound input section 11, a band dividing section 12, an excessive output notification section 13, a correction band decision section 14 and a sound output control section 15.

The sound input section 11 converts input sound into a sound signal S1 and outputs the sound signal S1 to the band dividing section 12. The band dividing section 12 divides the sound signal S1 for each predetermined frequency band (carries out band-division with respect to the sound signal S1) and outputs it as a band-divided sound signal S2.

The excessive output notification section 13 outputs excessive output notification information S3 to the correction band decision section 14 in response to button operation or the like by a user when the user who uses the sound volume control device 1 determines that output sound actually input to a user's ear via the sound volume control device 1 is excessive. The correction band decision section 14 calculates audible signal distribution information S4 of the user to be described below when the excessive output notification information S3 is not output from the excessive output notification section 13, and excessive signal distribution information S5 of the user to be described below when the excessive output notification information S3 is output from the excessive output notification section 13, for each band in the band-divided sound signal S2 subject to the band-division in the band dividing section 12, and decides a correction band according to the calculated audible signal distribution information S4 and excessive signal distribution information S5.

Here, the correction band decision section 14 includes an audible signal distribution information calculating section 141, an audible signal distribution information storing section 142, an excessive signal distribution information calculating section 143, an excessive signal distribution information storing section 144 and a frequency comparison correction band decision section 145.

The audible signal distribution information calculating section 141 calculates a signal level value which is power in a predetermined unit time (that is, power for a frame which includes successive sound data subject to the band-division) when the excessive output notification information S3 is not output from the excessive output notification section 13, for each band in the band-divided sound signal S2 subject to the band-division in the band dividing section 12. For example, the power is calculated by integrating spectrum power for each band in the band-divided sound signal S2 in the predetermined unit time. Then, the audible signal distribution information calculating section 141 calculates the audible signal distribution information S4 showing occurrence frequency distribution of frames having the same signal level value within a predetermined measurement time and stores the calculation result into the audible signal distribution information storing section 142. Here, the audible signal distribution information calculating section 141 counts the number of frames having the same signal level value within the predetermined measurement time in calculating the audible signal distribution information S4 when the excessive output notification information S3 is not output, and normalizes the count value by a predetermined parameter to provide an occurrence frequency. The predetermined parameter corresponds, when the audible signal distribution information storing section 142 deletes the audible signal distribution information S4 sequentially from older information after a predetermined time has elapsed, to a value obtained by dividing a time width of this predetermined time by a frame time width, for example.

The audible signal distribution information storing section 142 stores the audible signal distribution information S4 calculated by the audible signal distribution information calculating section 141. Here, the audible signal distribution information storing section 142 is configured to avoid too much influence of the old audible signal distribution information S4 when use environment has changed, by deleting audible signal distribution information S4 sequentially from older information after the predetermined time has elapsed. Note that the audible signal distribution information storing section 142 may not delete the audible signal distribution information S4 sequentially from older information after the predetermined time has elapsed, but instead be configured to reduce the influence of the old audible signal distribution information S4 by utilizing a weighted average or the like.

The excessive signal distribution information calculating section 143 calculates a signal level value which is power in a predetermined unit time (that is, power for a frame which includes successive sound data subject to the band-division) when the excessive output notification information S3 is output from the excessive output notification section 13, for each band in the band-divided sound signal S2 subject to the band-division in the band dividing section 12. For example, the power is calculated by integrating spectrum power for each band in the band-divided sound signal S2 in the predetermined unit time. Then, the excessive signal distribution information calculating section 142 calculates the excessive signal distribution information S5 showing occurrence frequency distribution of frames having the same signal level value in a predetermined measurement time, and stores the calculation result into the excessive signal distribution information storing section 144. Here, the excessive signal distribution information calculating section 143 counts the number of frames having the same signal level value in a predetermined measurement time in calculating the excessive signal distribution information S5 when the excessive output notification information S3 is output, and normalizes the count value by a predetermined parameter to provide an occurrence frequency. The predetermined parameter corresponds, when the excessive signal distribution information storing section 144 deletes the excessive signal distribution information S5 sequentially from older information after a predetermined time has elapsed, to a value obtained by dividing a time width of this predetermined time by a frame time width, for example.

The excessive signal distribution information storing section 144 stores the excessive signal distribution information S5 calculated by the excessive signal distribution information calculating section 143. Here, the excessive signal distribution information storing section 144, as with the audible signal distribution information storing section 142, is configured to avoid too much influence of the old excessive signal distribution information S5 when use environment has changed, by deleting excessive signal distribution information S5 sequentially from older information after the predetermined time has elapsed. Note that the excessive signal distribution information storing section 144, as with the audible signal distribution information storing section 142, may not delete the excessive signal distribution information 5 sequentially from older information after the predetermined time has elapsed, but instead be configured to reduce the influence of the old excessive signal distribution information S5 by utilizing a weighted average or the like.

The frequency comparison correction band decision section 145 compares the occurrence frequency in the audible signal distribution information S4 stored in the audible signal distribution information storing section 142 and the occurrence frequency in the excessive signal distribution information S5 stored in the excessive signal distribution information storing section 144, for each band in the band-divided sound signal S2 subject to the band-division in the band dividing section 12. Then, the frequency comparison correction band decision section 145 decides as the correction band a band in the band-divided sound signal S2 in which the occurrence frequency in the excessive signal distribution information S5 is larger than the occurrence frequency in the audible signal distribution information S4, and outputs it to the sound output control section 15 as correction band information S6. This will be specifically described below with reference to FIG. 3.

Further, the sound output control section 15 controls sound volume only for the correction band to provide output sound, among bands in the band-divided sound signal S2 subject to the band-division in the band dividing section 12, according to the correction band information S6 from the correction band decision section 14. Here, the sound output control section 15 includes a dynamic range compressing section 151, a signal synthesizing section 152 and a sound output section 153.

Figure 2:
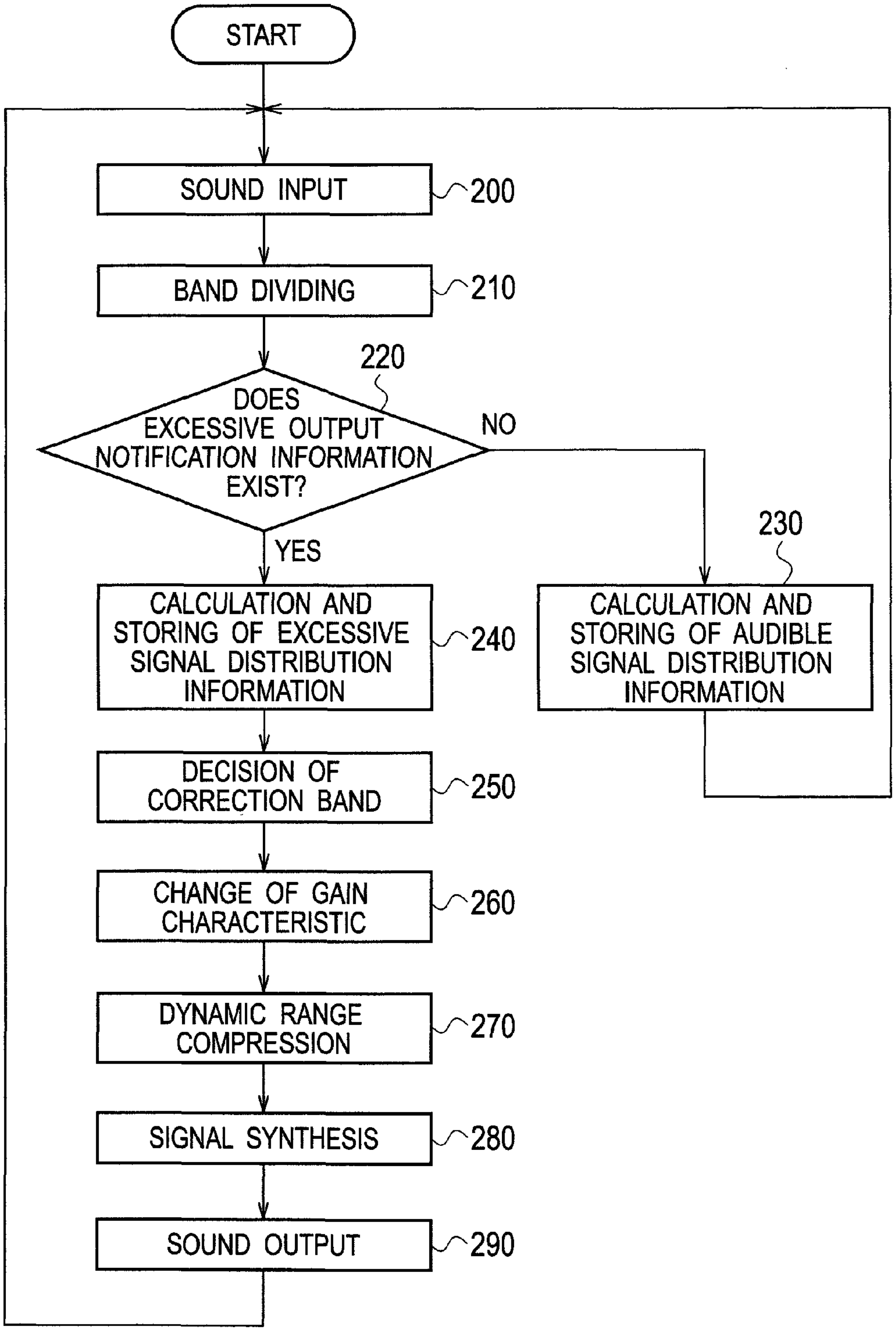
FIG. 2 is a flowchart showing an operation example of each constituent included in the sound volume control device according to the first embodiment of the present invention.

Next, the operation of the sound volume control device 1 configured as above will be described with reference to the flowchart of FIG. 2.

First, at a moment such as the turn-on of a power source which is not shown in the drawing, the sound volume control device 1 starts to operate and then, when sound is input from the outside into the sound volume control device 1 such as a hearing aid or a sound collector, the sound input section 11 converts the input sound into the sound signal S1 and outputs the sound signal S1 to the band dividing section 12 (Step 200).

The band dividing section 12 divides the sound signal S1 for each predetermined frequency band, and outputs it to the correction band decision section 14 and the sound output control section 15 as the band-divided sound signal S2 (Step 210). Here, the correction band decision section 14 is connected with the excessive output notification section 13 as shown in FIG. 1. The excessive output notification section 13 outputs the excessive output notification information S3 to the correction band decision section 14 when a user who uses the sound volume control device 1 such as a hearing aid or a sound collector feels that excessive output is output from the sound volume control device 1 and operates a button or the like.

The correction band decision section 14 determines whether or not the excessive output notification information S3 output from the excessive output notification section 13 is input into the correction band decision section 14 (Step 220). Here, when the excessive output notification information S3 is not output from the excessive output notification section 13 and the excessive output notification information S3 is not input into the correction band decision section 14 ("No" in Step 220), the audible signal distribution information calculating section 141 in the correction band decision section 14 calculates the audible signal distribution information S4 when the excessive output notification information S3 is not output from the excessive output notification section 13, for each band in the band-divided sound signal S2 subject to the band-division in the band dividing section 12 (Step 230), and stores the calculated audible signal distribution information S4 into the audible signal distribution information storing section 142. Specifically, the audible signal distribution information calculating section 141 calculates a signal level value for a frame in the predetermined unit time (e.g., 1 milli-second) when the excessive output notification information S3 is not output from the excessive output notification section 13, for each band in the band-divided sound signal S2 subject to the band-division in the band dividing section 12. The audible signal distribution information calculating section 141 then counts the number of frames having the same signal level value in the predetermined measurement time (e.g., within several seconds to several tens of seconds). The audible signal distribution information calculating section 141 normalizes the count value by the predetermined parameter and calculates the audible signal distribution information S4 as the occurrence frequency of the audible signal. The audible signal distribution information S4 shows occurrence frequency distribution of the audible signal with respect to a horizontal axis of a signal level value and a vertical axis of an occurrence frequency as shown in FIG. 3 to be described below.

On the other side, when the excessive output notification information S3 is output from the excessive output notification section 13 according to the user's operation and input into the correction band decision section ("YES" in Step 220), the excessive signal distribution information calculating section 143 in the correction band decision section 14 calculates the excessive signal distribution information S5 of the user when the excessive output notification information S3 is output from the excessive output notification section 13, for each band in the band-divided sound signal S2 subject to the band-division in the band dividing section 12 (Step 240), and stores the excessive signal distribution information S5 into the excessive signal distribution information storing section 144. Specifically, the excessive signal distribution information calculating section 143, as with the audible signal distribution information calculating section 141, calculates a signal level value for a frame in the predetermined unit time (e.g., 1 milli-second) when the excessive output notification information S3 is output from the excessive output notification section 13, for each band in the band-divided sound signal S2 subject to the band-division in the band dividing section 12. The excessive signal distribution information calculating section 143 then counts the number of frames having the same signal level value in the predetermined measurement time (e.g., within several seconds to several tens of seconds). The excessive signal distribution information calculating section 143 normalizes the count value by the predetermined parameter and calculates the excessive signal distribution information S5 as the occurrence frequency of the excessive signal. The excessive signal distribution information S5 shows occurrence frequency distribution of the excessive signal with respect to a horizontal axis of a signal level value and a vertical axis of an occurrence frequency as shown in FIG. 3 to be described below.

Next, in the correction band decision section 14, the frequency comparison correction band decision section 145 compares the occurrence frequency in the the audible signal distribution information S4 stored in the the audible signal distribution information storing section 142 and the occurrence frequency in the excessive signal distribution information S5 stored in the excessive signal distribution information storing section 144, for each band in the band-divided sound signal S2 subject to the band-division in the band dividing section 12, and decides the correction band according to the comparison result (Step 250). Here, the frequency comparison correction band decision section 145 outputs the correction band decided in this manner to the sound output control section 15 as the correction band information S6.

Figure 3:
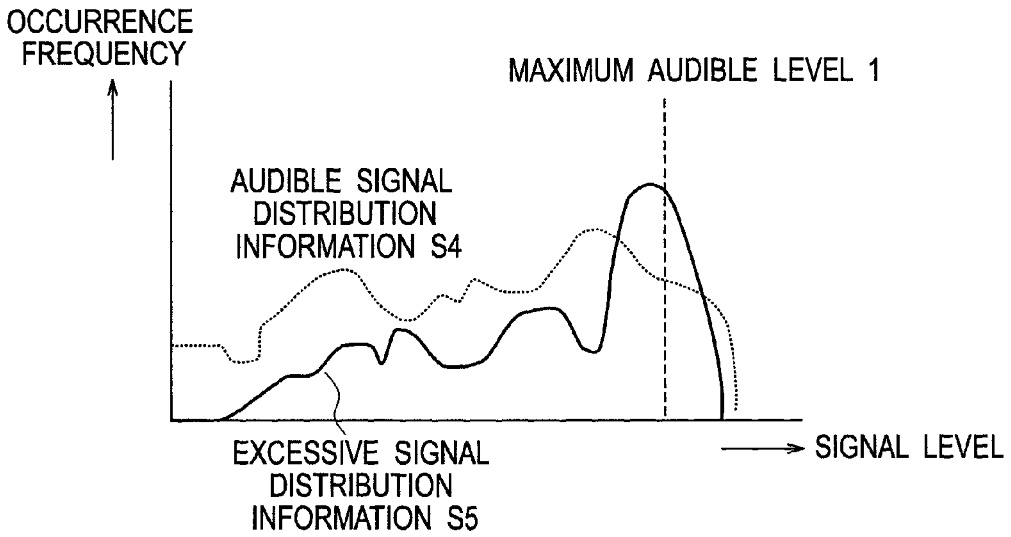
FIG. 3 is a diagram showing a comparison example between audible signal distribution information and excessive signal distribution information in a frequency comparison correction band decision section according to the first embodiment of the present invention.

In FIG. 3, the audible signal distribution information S4 and the excessive signal distribution information S5 are shown with respect to a horizontal axis of a signal level and a horizontal axis of an occurrence frequency.

As described above, for the audible signal distribution information S4 and the excessive signal distribution information S5, each of the audible signal distribution information calculating section 141 and the excessive signal distribution information calculating section 143 calculates a signal level value for a frame in the band-divided sound signal S2 for each band in the band-divided sound signal S2 in the predetermined unit time (e.g., 1 milli-second). Then, each of the audible signal distribution information calculating section 141 and the excessive signal distribution information calculating section 143 counts the number of frames having the same signal level value in the predetermined measurement time (e.g., within several seconds to several tens of seconds) and normalizes the count value by the predetermined parameter. The audible signal distribution information S4 and the excessive signal distribution information S5 show occurrence frequency distribution information sets of an audible signal and an excessive signal, respectively, with respect to a horizontal axis of a normalized signal level value and a vertical axis of a normalized occurrence frequency.

Here, in the present embodiment, the frequency comparison correction band decision section 145 compares, as shown in FIG. 3, the audible signal distribution information S4 and the excessive signal distribution information S5 in the vicinity of a predetermined maximum audible level 1 according to the user, for each band in the band-divided sound signal S2 subject to the band-division in the band dividing section 12. The frequency comparison correction band decision section 145 decides as the correction band a band in the band-divided sound signal S2 in which the occurrence frequency of excessive signal distribution information S5 is larger than the occurrence frequency of audible signal distribution information S4 in the vicinity of the predetermined maximum audible level 1.

Figure 4:
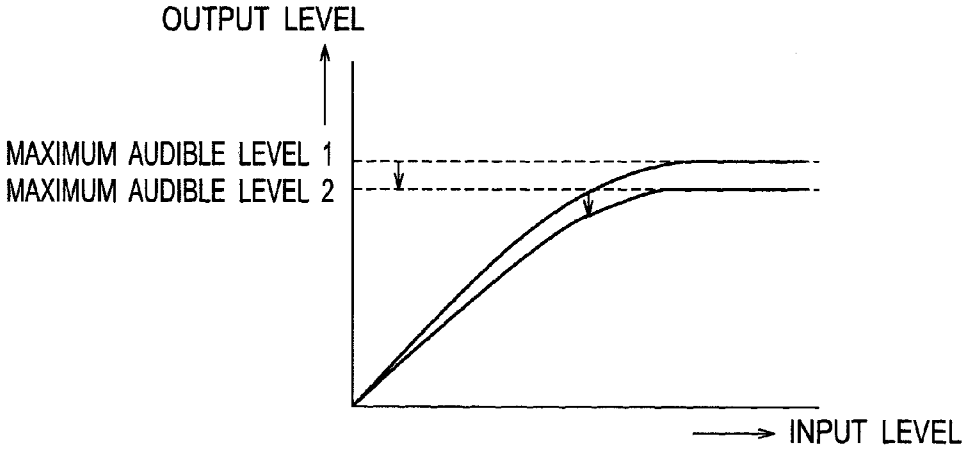
FIG. 4 is a diagram showing a change example of a gain characteristic (amplification characteristic) which changes when a maximum audible level is reduced by a dynamic range compressing section in a sound output control section according to the first embodiment of the present invention.
Figure 5:
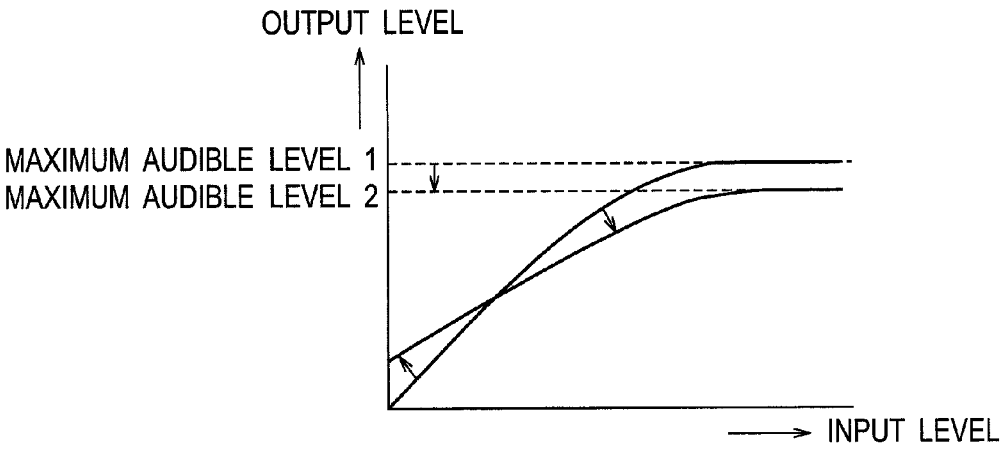
FIG. 5 is a diagram showing another change example of a gain characteristic (amplification characteristic) which changes when a maximum audible level is reduced by the dynamic range compressing section in the sound output control section according to the first embodiment of the present invention.

Next, when the correction band information S6 is output from the frequency comparison correction band decision section 145 in the correction band decision section 14 to the sound output control section 15, the dynamic range compressing section 151 in the sound output control section 15 first performs change processing with respect to the dynamic range gain characteristic (amplification characteristic) as shown in FIGS. 4 and 5 to be described below (Step 260). Specifically, the dynamic range compressing section 151 changes the dynamic range of the band-divided sound signal S2 only for the correction band designated by the correction band information S6 according to the correction band information S6 to reduce the maximum audible level 1 for the correction band down to a maximum audible level 2 (Step 270). Namely, the dynamic range compressing section 151 performs the change processing with respect to the dynamic range gain characteristic in Step 260 every time the excessive output notification information S3 is output from the excessive output notification section 13 and input to the correction band decision section 14 according to the user's operation. The dynamic range compressing section 151 then compresses the dynamic range of the band-divided sound signal S2 only for the correction band according to the gain characteristic after the change processing (Step 270).

Each of FIGS. 4 and 5 is a diagram showing an example of the change in the gain characteristic (amplification characteristic) which changes according to the maximum audible level-down performed by the dynamic range compressing section 151 in the sound output control section 15. Note that, in each of FIGS. 4 and 5, the horizontal axis shows an input level of the band-divided sound signal S2 in the correction band designated by the correction band information S6 and the vertical axis shows an output level thereof.

In the example of FIG. 4, the dynamic range compressing section 151 in the sound output control section 15 activates a limiter having the upper limit of predetermined maximum audible level 1 according to the user and reduces the dynamic range from the maximum audible level 1 to the maximum audible level 2 according to the gain characteristic, for the band-divided sound signal S2 only in the correction band designated by the correction band information S6. Here, in the case shown in FIG. 4, the dynamic range compressing section 151 changes the gain characteristic in a larger extent by the processing of Step 260 to increase a reduction step from the maximum audible level 1 to the maximum audible level 2 and gradually reduces the value of maximum audible level 2, every time the excessive output notification information S3 is output from the excessive output notification section 13 according to the user' s operation. Here, the maximum audible level 1 in FIG. 4 is the same as the maximum audible level 1 in FIG. 3.

In the example of FIG. 5, the dynamic range compressing section 151 in the sound output control section 15 activates the limiter having the upper limit of a predetermined maximum audible level 1 according to the user and reduces the dynamic range from the maximum audible level 1 to the maximum audible level 2 as shown in FIG. 5, for the band-divided sound signal S2 only in the correction band designated by the correction band information S6, and also the dynamic range compressing section 151 further changes the slope in the gain characteristic of the band-divided sound signal S2 by multiplication of a predetermined compression rate. Here, in the case shown in FIG. 5, the dynamic range compressing section 151 changes the gain characteristic such as the predetermined compression rate and the like in a larger extent by the processing in Step 260 to gradually reduce the value of maximum audible level 2 and also change the slope in the gain characteristic of the band-divided sound signal S2, every time the excessive output notification information S3 is output from the excessive output notification section 13 according to the user's operation. Here, the maximum audible level 1 in FIG. 5, as with the maximum audible level 1 in FIG. 4, is the same as the maximum audible level 1 in FIG. 3.

Thereby, in both cases shown in FIGS. 4 and 5, the dynamic range compressing section 151 in the sound output control section 15 can reduce the maximum audible level 2 gradually every time the excessive output notification information S3 is output from the excessive output notification section 13. Accordingly, sound volume is not reduced abruptly and usability and use feeling of the present device is improved in this point. Note that the dynamic range compressing section 151 in the sound output control section 15 may only reduce the dynamic range down to sound volume which is not felt to be excessive by the user, for the band-divided sound signal S2 only in the correction band designated by the correction band information S6, and the method thereof is not limited to the methods shown in FIGS. 4 and 5. Further, so as to enable the dynamic range compressing section 151 in the sound output control section 15 to update the dynamic range compression gain characteristic, the present device may be configured such that the excessive output notification information S3 is output directly to the dynamic range compressing section 151 from the excessive output notification section 13.

Next, the signal synthesizing section 152 combines the band-divided sound signal S7 in the correction band in which the dynamic range is compressed by the dynamic range compressing section 151 and the band-divided sound signal S2 in bands except the correction band each in which the dynamic range is not compressed and left without change (Step 280), and outputs the result as a synthetic sound signal S8 to the sound output section 153. The sound output section 153 then receives the synthetic sound signal S8 from the signal synthesizing section 152 and converts the synthetic sound signal S8 into output sound which is output to a user's ear or the like via an earphone or the like (Step 290).

Consequently, according to the sound volume control device 1 of the present embodiment, the correction band decision section 14 calculates the audible signal distribution information S4 of the user when the excessive output notification information S3 is not output from the excessive output notification section 13 and the excessive signal distribution information S5 of the user when the excessive output notification information S3 is output, for each band in the band-divided sound signal S2 subject to the band-division in the band dividing section 12, and decides a correction band according to the audible signal distribution information S4 and the excessive signal distribution information S5, and the sound output control section 15 provides output by compressing the dynamic range in the correction band so as to cause the sound signal in the correction band not to have excessive volume. Thereby, it is possible to adjust the maximum output level of the sound in the band where the user feels in actual life that sound is excessive, without asking the user to hear the test audibility data.

In particular, in the sound volume control device 1 of the present embodiment, the dynamic range compressing section 151 in the sound output control section 15 is configured to perform the change processing with respect to the dynamic range gain characteristic to compress the dynamic range of the band-divided sound signal S2 only in the correction band according to the gain characteristic after the change processing, every time the excessive output notification information S3 is output from the excessive output notification section 13 according to the user's operation, and thereby the maximum audible level 2 or the slope of the gain characteristic is reduced gradually according to the number of outputs of the excessive output notification information S3 from the user. As a result, according to the sound volume control device 1 of the present embodiment, it becomes possible to perform the compression of the dynamic range by gradually learning the sound which is felt sometimes to be annoying by the user who uses the present device in an actual utilization environment, and it is possible to perform the dynamic range compression processing more suitable for the utilization environment by gradually performing the threshold value decision based on a subjective view of the user which is difficult to perform in a conventional adjustment method.

(Second Embodiment)

Figure 6:
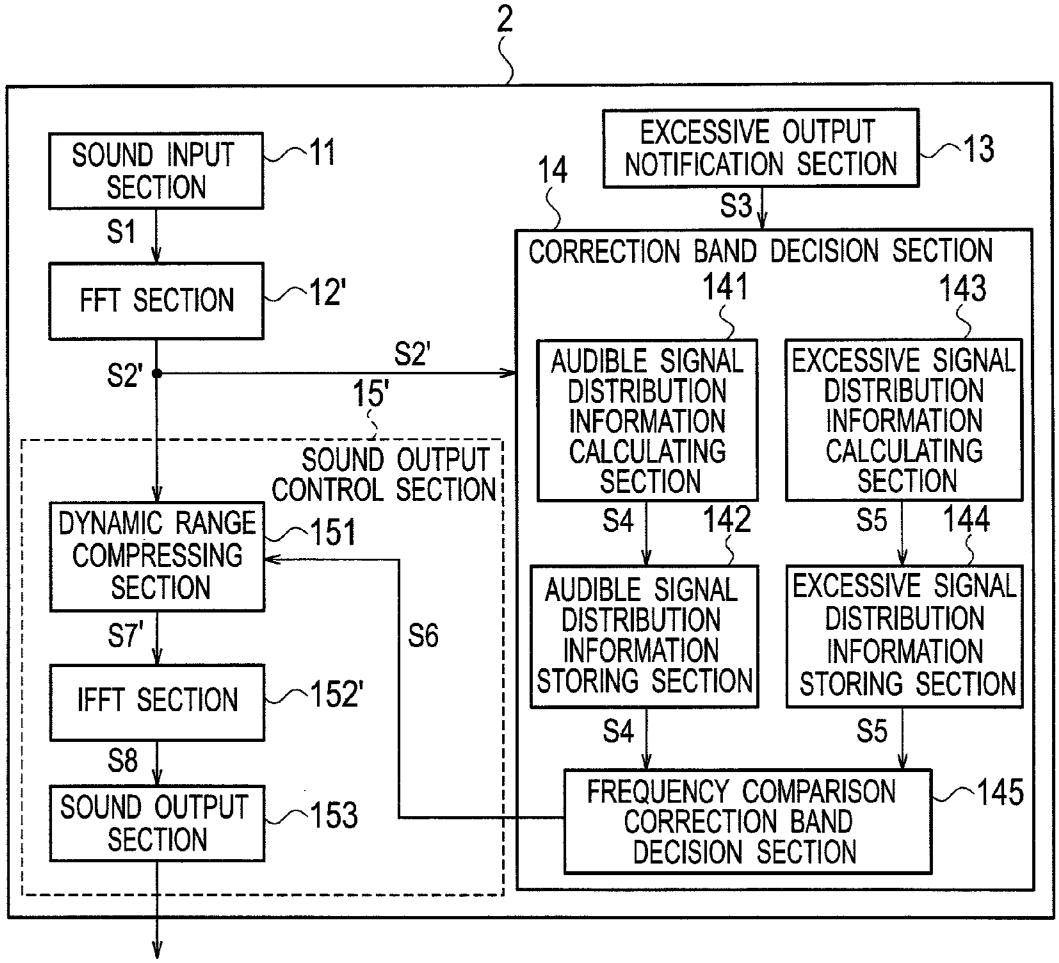
FIG. 6 is a block diagram showing a configuration example of a sound volume control device according to a second embodiment of the present invention.

Next, the sound volume control device according to the second embodiment of the present invention will be described with reference to FIG. 6. Note that, in FIG. 6, the same constituent as that of the sound volume control device 1 in the first embodiment shown in FIG. 1 is provided with the same reference numeral for the explanation.

A sound volume control device 2 includes a sound input section 11, a fast Fourier transform (FFT) section 12', an excessive output notification section 13, a correction band decision section 14 and a sound output control section 15'. The sound output control section 15' includes a dynamic range compressing section 151, an inverse fast Fourier transform (IFFT) section 152' and a sound output section 153.

Thus, the sound volume control device 2 includes the fast Fourier transform section 12' and the inverse fast Fourier transform section 152' instead of the band dividing section 12 and the signal synthesizing section 152 in the sound volume control device 1 of the first embodiment shown in FIG. 1, respectively, and the other constituents are the same as those of the sound volume control device 1 in the first embodiment. While the sound volume control device 1 of the first embodiment shown in FIG. 1 is configured to divide the sound signal S1 for each predetermined frequency band thereof in the band dividing section 12 and decide a correction band where the dynamic range is to be compressed, the sound volume control device 2 is configured to carries out Fourier transform with respect to the sound signal S1 in the fast Fourier transform section 12' to divide the sound signal S1 into Fourier coefficients S2' which are waveform components of plural frequency components and decide a correction band where the dynamic range is to be compressed.

Accordingly, in the sound volume control device 2, when an input sound signal S1 is input from the sound input section 11 to the fast Fourier transform section 12', the fast Fourier transform section 12' obtains the Fourier coefficients S2' from the input sound signal S1 and outputs the Fourier coefficients S2' to the correction band decision section 14 and the sound output control section 15'.

When excessive output notification information S3 is not received from the excessive output notification section 13, an audible signal distribution information calculating section 141 calculates a signal level value which is power for a predetermined unit time (that is, power for a frame which includes successive sound data subject to the Fourier transform) for each input Fourier coefficient S2' as in the first embodiment, and counts the number of frames having the same signal level value in a predetermined measurement time (e.g., within several seconds to several tens of seconds). For example, the power is calculated by squaring the input Fourier coefficient S2' in the predetermined unit time. Then, the audible signal distribution information calculating section 141 calculates audible signal distribution information S4 as an occurrence frequency of audible signals by normalizing the count value by a predetermined parameter, and updates the audible signal distribution information S4 stored in an audible signal distribution information storing section 142.

On the other side, the correction band decision section 14, when receiving the excessive output notification information S3 which is output from the excessive output notification section 13 by user's operation, calculates a signal level value which is power for a predetermined unit time (that is, power for a frame which includes successive sound data subject to the Fourier transform) for each input Fourier coefficient S2'. For example, the power is calculated by squaring the input Fourier coefficient S2' in the predetermined unit time. Then, the correction band decision section 14 similarly calculates excessive signal distribution information S5 and updates the excessive signal distribution information S5 stored in an excessive signal distribution information storing section 144.

Then, in the correction band decision section 14, a frequency comparison correction band decision section 145, as in the first embodiment, compares the excessive signal distribution information S5 and the audible signal distribution information S4, decides a band where the excessive signal distribution information S5 shows a higher frequency than the audible signal distribution information S4 in the vicinity of a predetermined maximum audible level 1, as a correction band of a correction target, and outputs the decided correction band information S6 to the sound output control section 15'.

Next, in the sound output control section 15', the dynamic range compressing section 151 first performs dynamic range compression such as reduction from the maximum audible level 1 to the maximum audible level 2, as in the case of the first embodiment, with respect to a Fourier coefficient S2' corresponding to a frequency band which is determined to be the correction band among the Fourier coefficients S2' from the fast Fourier transform section 12' according to the correction band information S6 from the correction band decision section 14, and outputs the result and the other Fourier coefficients S2' to the IFFT section 152 as Fourier coefficient S7'.

The inverse fast Fourier transform (IFFT) section 152' performs the inverse fast Fourier transform with respect to the Fourier coefficient S7' including the Fourier coefficient S2' corresponding to the correction band in which the dynamic range compression is performed by the dynamic range compressing section 151, to return the Fourier coefficient S7' to a sound signal S8 on the time axis, and outputs the sound signal S8 to the sound output section 153. Then, the sound output section 153 outputs output sound S9 according to the sound signal S8, as in the first embodiment.

In the sound volume control device 2, the fast Fourier transform section 12' and the inverse fast Fourier transform section 152' are provided instead of the band dividing section 12 and the signal synthesizing section 152, respectively, in the sound volume control device 1 of the first embodiment shown in FIG. 1. Accordingly, as in the sound volume control device 1 of the first embodiment, it is possible to adjust the maximum output level of the sound in a band where the user feels in actual life that sound is excessive, without asking the user to hear the test audibility data. Further, it is possible to perform the dynamic range compression processing more suitable for the utilization environment by performing the change processing with respect to the dynamic range gain characteristic every time the excessive output notification information S3 is output.

Lastly, each of the above embodiments is an example of the present invention. Therefore, it is to be added that the present invention is not limited to the above embodiments and various modifications are possible according to design and the like in a range without departing from the technical idea according to the present invention.

What is claimed is:

1. A sound volume control device comprising:

a sound input section that converts input sound into a sound signal;

a band dividing section that carries out band-division with respect to the sound signal;

an excessive output notification section that outputs excessive output notification information according to user' s operation; and a correction band decision section that calculates audible signal distribution information of the user when the excessive output notification information is not output and excessive signal distribution information of the user when the excessive output notification information is output, for each band in the sound signal subject to the band-division in the band dividing section, and decides a correction band according to the calculated audible signal distribution information and excessive signal distribution information, and a sound output control section that controls sound volume of sound signal for the correction band decided by the correction band decision section to provide output sound, among bands in the sound signal subject to the band-division in the band dividing section.

2. The sound volume control device according to claim 1, wherein the correction band decision section includes:

an audible signal distribution information calculating section that calculates a signal level value for a frame when the excessive output notification information is not output and calculates the audible signal distribution information showing occurrence frequency distribution of frames having the same signal level value within a predetermined measurement time, for each band in the sound signal subject to the band-division in the band dividing section;

an audible signal distribution information storing section that stores the audible signal distribution information calculated by the audible signal distribution information calculating section;

an excessive signal distribution information calculating section that calculates a signal level value for a frame when the excessive output notification information is output and calculates the excessive signal distribution information showing occurrence frequency distribution of frames having the same signal level value within a predetermined measurement time, for each band in the sound signal subject to the band-division in the band dividing section; and an excessive signal distribution information storing section that stores the excessive signal distribution information calculated by the excessive signal distribution information calculating section, and a frequency comparison correction band decision section that compares the occurrence frequency in the audible signal distribution information stored in the audible signal distribution information storing section and the occurrence frequency in the excessive signal distribution information stored in the excessive signal distribution information storing section, for each band in the sound signal subject to the band-division in the band dividing section, and decides, as a correction band, a band in which the occurrence frequency in the excessive signal distribution information is larger than the occurrence frequency in the audible signal distribution information.

3. The sound volume control device according to claim 2, wherein the audible signal distribution information storing section and the excessive signal distribution information storing section delete the stored audible signal distribution information and the stored excessive signal distribution information sequentially from older information, respectively.

4. The sound volume control device according to claim 2, wherein the frequency comparison correction band decision section compares the occurrence frequency in the audible signal distribution information and the occurrence frequency in the excessive signal distribution information in the vicinity of a predetermined maximum audible sound volume level for each band in the sound signal subject to the band-division in the band dividing section, and decides, as the correction band, the band in which the occurrence frequency in the excessive signal distribution information is larger than the occurrence frequency in the audible signal distribution information.

5. The sound volume control device according to claim 4, wherein the sound output control section controls sound volume by reducing a part exceeding the predetermined maximum audible sound volume level in the correction band decided by the correction band decision section down to an audible sound volume level according to a predetermined limiter curve and outputs the sound volume, and sets the predetermined maximum audible sound volume level to be lower every time receiving the excessive output notification from the excessive output notification section.

6. The sound volume control device according to claim 4, wherein the sound output control section controls sound volume by multiplying by a predetermined compression rate a part exceeding the predetermined maximum audible sound volume level in the correction band decided by the correction band decision section to compress a dynamic range and outputs the sound volume, and sets a compression rate of the dynamic range to be larger every time receiving the excessive output notification from the excessive output notification section.

7. A sound volume control method comprising the steps of:

converting input sound into a sound signal;

carrying out band-division with respect to the sound signal;

determining whether or not excessive output notification information is output by user's operation;

calculating a signal level value for a frame when the excessive output notification information is not output and calculating audible signal distribution information showing occurrence frequency distribution of frames having the same signal level value within a predetermined measurement time, for each band in the sound signal;

calculating a signal level value for a frame when the excessive output notification information is output and calculating excessive signal distribution information showing occurrence frequency distribution of frames having the same signal level value within a predetermined measurement time, for each band in the sound signal;

comparing the audible signal distribution information and the excessive signal distribution information for each band in the sound signal and deciding a correction band according to the comparison result; and controlling sound volume of sound signal for the correction band to provide output sound.

8. A non-transitory computer readable medium storing a sound volume control program which when executed performs the steps of:

converting input sound into a sound signal;

carrying out band-division with respect to the sound signal;

determining whether or not excessive output notification information is output by user's operation;

calculating a signal level value for a frame when the excessive output notification information is not output and calculating audible signal distribution information showing occurrence frequency distribution of frames having the same signal level value within a predetermined measurement time, for each band in the sound signal;

calculating a signal level value for a frame when the excessive output notification information is output and calculating excessive signal distribution information showing occurrence frequency distribution of the frames having the same signal level value within a predetermined measurement time, for each band in the sound signal;

comparing the audible signal distribution information and the excessive signal distribution information for each band in the sound signal and deciding a correction band according to the comparison result; and controlling sound volume of sound signal for the correction band to provide output sound.

* * * * *